United States Patent
Goo et al.

(10) Patent No.: US 6,757,052 B2
(45) Date of Patent: Jun. 29, 2004

(54) SINGLE APERTURE OPTICAL SYSTEM FOR PHOTOLITHOGRAPHY SYSTEMS

(75) Inventors: Doo-Hoon Goo, Busan (KR); Jin-Jun Park, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 64 days.

(21) Appl. No.: 10/162,601

(22) Filed: Jun. 6, 2002

(65) Prior Publication Data

US 2003/0086070 A1 May 8, 2003

(30) Foreign Application Priority Data

Nov. 5, 2001 (KR) .......................................... 2001-68657

(51) Int. Cl.[7] ........................... G03B 27/54; G03B 27/42
(52) U.S. Cl. ........................................... 355/67; 355/53
(58) Field of Search ...................................... 355/53, 67

(56) References Cited

U.S. PATENT DOCUMENTS

| 5,446,587 A | | 8/1995 | Kang et al. |
| 5,719,704 A | * | 2/1998 | Shiraishi et al. ............. 359/558 |
| 5,757,470 A | | 5/1998 | Dewa et al. .................. 355/87 |
| 5,978,072 A | | 11/1999 | Nojima ......................... 355/71 |
| 6,236,449 B1 | * | 5/2001 | Tanitsu ......................... 355/67 |
| 6,285,443 B1 | * | 9/2001 | Wangler et al. ............... 355/67 |
| 6,452,662 B2 | * | 9/2002 | Mulkens et al. .............. 355/67 |
| 6,583,855 B2 | * | 6/2003 | Krikke et al. ................. 355/67 |

FOREIGN PATENT DOCUMENTS

JP  5-335208  12/1993

* cited by examiner

Primary Examiner—Alan Mathews
(74) Attorney, Agent, or Firm—Lee & Sterba, P.C.

(57) ABSTRACT

Methods and apparatus for varying the number and intensity of beams of a photo-lithographic light source for exposing photoresist materials include beam dividers and beam focusing means. Methods include producing an incident light beam having uniform intensity distribution, refracting the incident light beam into a plurality of divergent beams, refracting the plurality of divergent beams into a plurality of parallel beams, and exposing an object with light of the plurality of parallel beams. Apparatus includes source of light beam having uniform intensity distribution, first refracting element for refracting the light beam into a plurality of divergent beams, second refracting element for refracting the plurality of divergent beams into a plurality of parallel beams, and means for exposing the object with light of the plurality of parallel beams. Variations in the separations of the refractive elements allows for the control of the size, shape, and dispersion patterns of resultant beams.

9 Claims, 8 Drawing Sheets

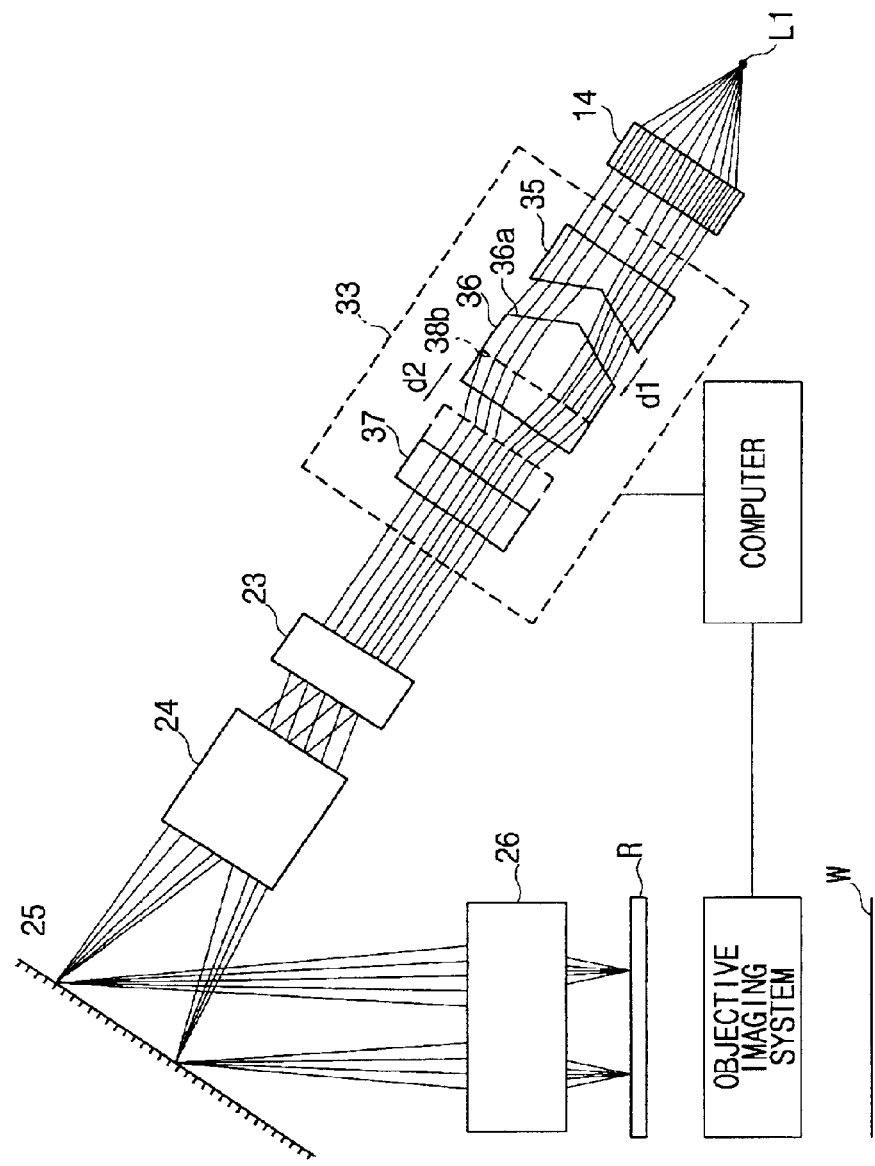

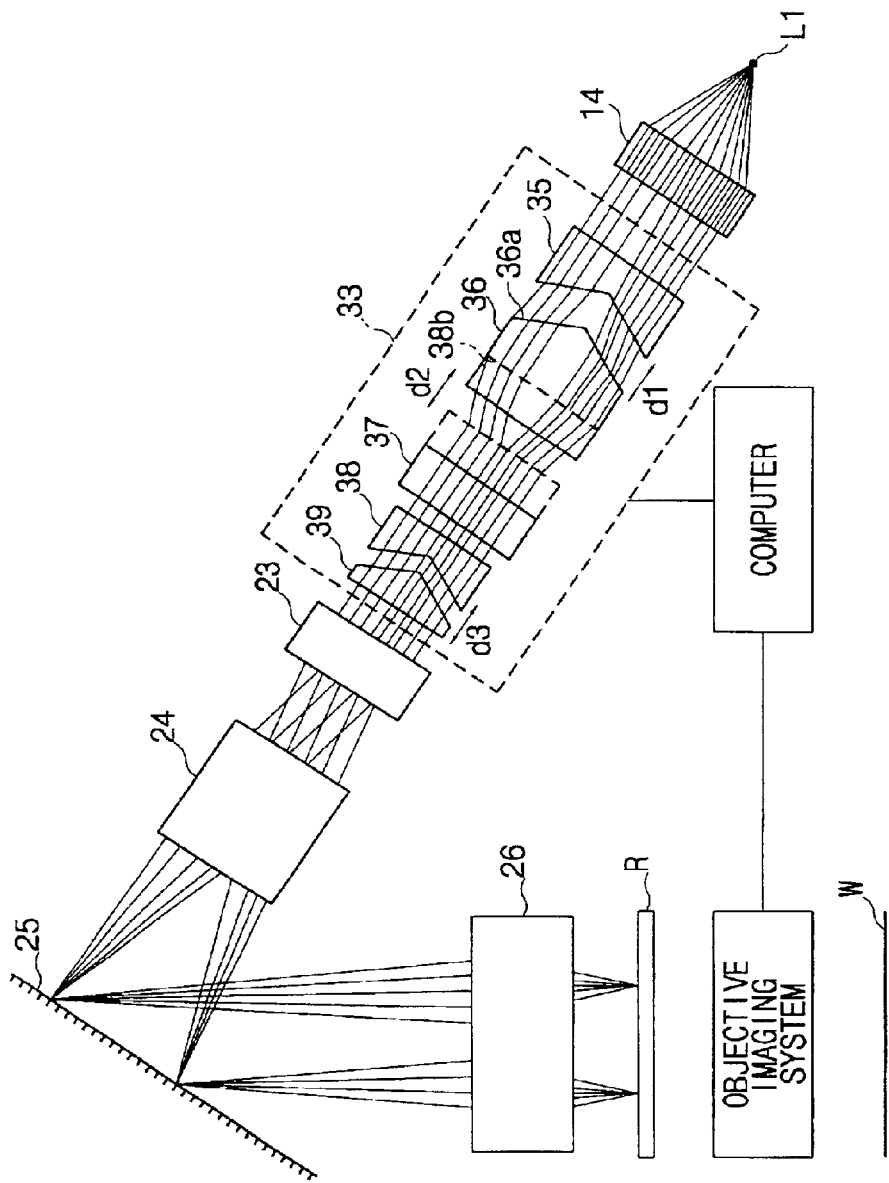

SINGLE APERTURE OPTICAL SYSTEM FOR PHOTOLITHOGRAPHY SYSTEMS

BACKGROUND OF THE INVENTION

1. Field of the Invention

This invention relates to an exposure apparatus and, more particularly, to a projection exposure apparatus featuring an adjustable aperture-free optical illumination system for exposing a semiconductor wafer, an in particular, a photo-resist layer on a semiconductor wafer.

2. Description of the Related Art

When manufacturing a semiconductor integrated circuit, printed circuit board, or liquid crystal substrate, a predetermined pattern is formed on a photo-resist film deposited on a substrate using a photolithographic technique, i.e., by light exposure from a projection exposure apparatus. Such a projection exposure apparatus typically has a light source that illuminates a reticule (mask) having an opaque circuit pattern, and when an illumination light passes through the reticule, an image of the reticule pattern is formed on the photo-resist, thereby exposing the photo-resist material. As the resolution of the patterns increases with higher-density integration, however, such conventional lithographic techniques can produce missing or broken lines in the resulting patterns.

FIG. 1 illustrates a conventional projection exposure apparatus. Exposure light L1 emitted from an illumination optical system 2 illuminates a reticule R, held by a reticule holder 3. When the exposure light L1 passes through the reticule pattern PA of the reticule R, a pattern image of the reticule pattern PA is projected onto wafer W. In the illumination optical system of the projection exposure apparatus, exposure light L1 emitted from a light source 10 of the illumination optical system 2 is collected by an elliptical mirror 11. After reflection by mirror 12, the intensity distribution of the exposure light L1 is made uniform using a fly-eye lens 14 and is directed to a rotational aperture plate 20, which is positioned in the focal plane behind the fly-eye lens 14.

Rotational aperture plate 20 further includes a plurality of selectable aperture stops (21–26), each one being a different type or having a unique size, that are concentrically formed at predetermined intervals around the circumference of rotational aperture plate 20 as shown in FIG. 2. A motor 30 provides rotational control for moving a selected aperture stop (21–26) into the axis of light beam L1 to provide a predetermined configuration to the light beam L1 for illuminating reticule R. Disadvantageously, such a rotational aperture exposure system typically must be made large to accommodate the size of rotational aperture plate 20 and motor 30.

Further, having a light beam that has a cone-shaped dispersion characteristic passing through a central portion of a reticule R provides an illumination pattern that extends to areas beyond the edges of the reticule R. FIG. 3 illustrates one such dispersed light beam passing through reticule R of FIG. 1. An optimized beam portion 6 would preferably be collimated so as to be directed parallel to the optical axis to an edge 7 of reticule R and thence to a target on wafer W, such that dispersion is restricted by a shadowing effect of an opaque edge of reticule R. Conical dispersion back toward the center of the optical axis would further illuminate the center of wafer W without detriment. In conventional projection apparatus, however, a typical beam from a single light source 11 of FIG. 1 is not directed parallel to the optical axis at the edges of the reticule R, as with beam 6, but is instead directed along the central axis 8 of the reticule R, with a conical dispersion that illuminates wafer W at point 9, which is outside the desired illumination area. Any photoresist in such an area would be exposed and subsequently processed with undesirable consequences to the targeted area/circuitry.

Another disadvantage with this type of conventional aperture wheel is that a particular one of the available apertures is selected to optimally match the exposure characteristics of the aperture to a desired pattern to be masked. For example, a thin conductive line would typically be exposed using a "line" aperture, while a pad or a thick line could be formed using a larger area aperture, such as a "flash," a "circular," or a "rectangular" aperture. While a thin line aperture can be used to create a large area pad using repeated passes, each one having a slight offset, misalignment between passes can leave undesirable trace defects where the exposure passes did not overlap sufficiently.

A more significant disadvantage of such a system is a lack of precision in the rotational stops and control of the rotational drive device, i.e., motor 30. Depending on the particular motor control techniques being employed, the plate can be rotated only to within a tolerance of the slippage or step of the motor, which can vary over time and with environmental conditions. Slow response properties and degraded positional-detection accuracy of a control and motion sensing mechanism can also detrimentally affect the precision of the aperture alignment. Further, properties of the attachment mechanism, such as bearings and gears, can produce unwanted motion and/or displacement in any of the X, Y, Z directions, producing undesired variations in a finished pattern.

In still another conventional approach using an optical aperture rather than an aperture wheel, an annular intensity profile is created and varied by using diverging and counter-diverging elements that are movable relative to each other in the illumination path, preferably under control of a computer. As shown in FIG. 4, an apparatus that provides such a beam variation comprises a pair of refractive elements 38 and 39 with confronting conical surfaces. FIG. 5 illustrates an exploded view of the conical refracting apparatus 25 shown in FIG. 4.

In the operation of the apparatus shown in FIG. 4, a concave conical surface of a first element diverges the illumination into an annular configuration having a radius that increases with distance from the first element. A complementary convex conical surface of a second element counters the divergence caused by the first element and restores the original directional orientation to the illumination, thereby fixing the radius of the annular intensity profile. The first and second elements are movable relative to each other, such that the distance between them is variable. The radius of the annular divergence of the illumination is a function of the distance between the first and second elements.

Disadvantageously, the complementary concave and convex conical elements are difficult to manufacture, and thus expensive, and the apparatus only provides for an annular intensity profile, rather than the multitude of aforementioned desired geometric shapes. In contrast, embodiments according to the present invention produce illumination profiles using simple planar surfaces which can be created with greater ease and precision of manufacturing while also providing for the creation and variation of both dipole and quadrapole intensity profiles.

SUMMARY OF THE INVENTION

A first embodiment of an exposure apparatus for creating a variable light intensity profile in a photolithographic process according to the present invention preferably comprises at least one complementary pair of transparent elements, wherein a first transparent element has an adjacent pair of first planar interface surfaces for dividing an incident light beam and refracting the portions of the divided beam away from an incident optical axis and a second transparent element has an adjacent and complementary pair of second planar interface surfaces for restoring the original directionality to the beam portions via refraction at the second planar interface surface, producing a bipolar beam.

The second planar interface surface is preferably parallel to and orthogonally displaced from the first planar interface surface. The degree of dispersion of the light beam portions is directly proportional to the displacement between the opposing refractive surfaces. Such an apparatus allows for the divergence of the incident beam along a single axis. Preferably a first motor acting upon one or both of the transparent elements is the motive means for displacing the first and second transparent elements relative to the other. As the two separate beams are directed to a reticle, they are displaced from and parallel to the central optical axis, thereby reducing the beam dispersion beyond the edges of the reticle.

A second embodiment of the present invention comprises the transparent elements of the first embodiment combined with a second pair of complementary transparent elements having a third and fourth opposing planar interface surfaces, respectively, arranged such that the opposing refractive surfaces of the second pair of transparent elements are rotated orthogonally about the optical axis, so as to produce a second division and refraction of the incident light beam that is orthogonal to the first division and refraction of the incident light beam. Such combination of the first and second division and refraction produces a quadrapolar intensity profile that can be refracted and displaced in two dimensions. Preferably, a second motor acting upon one or both of the second pair of transparent elements is the motive means for displacing the third and fourth transparent elements relative to the other. As the four separate quadrature beams are directed to a reticle, they are displaced from and parallel to the central optical axis, thereby further reducing the beam dispersion beyond the edges of the reticle.

A third embodiment of an exposure apparatus according to the present invention preferably comprises the quadrapolar transparent elements of the second embodiment, wherein the second transparent element of the first pair of transparent elements and the first transparent element of the second pair of transparent elements are joined or manufactured as a common element while maintaining the orientation of the separate planar refractive surfaces.

A fourth embodiment, according to the present invention, combines the second embodiment with a conical divergence element having a variable annular intensity profile. Such an embodiment can selectively provide a bipolar, a quadrature, or an annular pattern, or combination thereof, depending on the separation between the opposing refractive element surfaces.

The refractive elements of the above embodiments are preferably moveable under control of a computer. Various sensing means can be employed to provide feedback to the computer for adjustment. These can sense lateral displacements of the refractive elements, a light intensity profile at a target, a light intensity in a region beyond the masked area of the reticle, or other suitable proportional sensing arrangements.

In accordance with a preferred embodiment of the present invention, there is provided a method for exposing an object with a light, comprising:

A) producing an incident light beam having a uniform intensity distribution;

B) refracting the incident light beam into a plurality of divergent light beams;

C) refracting the plurality of divergent light beams into a plurality of parallel light beams; and D) exposing the object with light of the plurality of parallel light beams. The plurality of divergent light beams may have a combined intensity that is about equal to the intensity of the light beam before refraction. The incident light beam may be refracted into the plurality of divergent light beams at about a same angle or at different angles. The incident light beam may be refracted into two or four or more divergent light beams. The direction of the refraction of the light beam into two divergent light beams and a direction of the refraction of the light beam into four divergent light beams may be at an angle, and the angle may be between about 45 to about 90 degrees. The incident light beam may be refracted into four parallel light beams by refracting the incident light beam into two divergent light beams, refracting the two divergent light beams into two parallel light beams, refracting the two parallel light beams into four divergent light beams, and refracting the four divergent light beams into the four parallel light beams.

In accordance with another embodiment of the present invention, there is provided a method for exposing an object with a light, comprising:

A) producing an incident light beam having a uniform intensity distribution;

B) refracting the incident light beam into a plurality of divergent light beams;

C) refracting the plurality of divergent light beams into a plurality of parallel light beams;

D) refracting the plurality of parallel light beams in an annular pattern; and

E) exposing the object with light of the plurality of parallel light beams refracted in the annular pattern.

A method for creating a dipole variable light intensity profile in a photolithographic process according to the present invention preferably comprises:

1) creating a light beam using a light source;

2) directing the light beam to an apparatus further comprising a first and second transparent element and a motive means for moving the first and second transparent elements relative to each other along an optical axis;

3) applying an activating control signal to the motive means for separating the first and second transparent elements a predetermined distance from one another;

4) sensing the separation between the first and second transparent elements using a computing device;

5) comparing the measured separation with a value stored in a storage device of the computing device;

6) when the measure value corresponds to the stored value, removing the activating control signal in order to stop the movement of the first and second transparent elements relative to one another, 7) directing the light beam into a first orthogonal surface of the first transparent element;

8) dividing the light beam into two portions and refracting the two portions of the light beam at a pair of angled planar surfaces on an opposite side of the first transparent element;

9) re-refracting the two portions of the refracted light beams back to the optical axis at a pair of angled planar surfaces on a first side of the second transparent element, which has a complementary structure to the first pair of angled planar surfaces; and 10) directing the two portions of the light beam into an exit orthogonal surface of the second transparent element and then to a target.

A method for creating a quadrapole variable light intensity profile in a photolithographic process according to the present invention preferably comprises the steps of:

1) creating a light beam using a light source;

2) directing the light beam to an apparatus further comprising a first, a second, a third, and a fourth transparent element and a motive means for moving the first, second, third, and fourth transparent elements relative to each other along an optical axis;

3) applying an activating control signal to the motive means for separating the first and second transparent elements a first predetermined distance from one another and the third and fourth transparent elements a second predetermined distance from one another;

4) sensing the separation between the first and second transparent elements using a computing device;

5) comparing the first measured separation with a first value stored in a storage device of the computing device;

6) when the first measure value corresponds to the first stored value, removing the activating control signal to stop the movement of the first and second transparent elements relative to one another, 7) sensing the separation between the third and fourth transparent elements using the computing device;

8) comparing a second measured separation with a second value stored in a storage device of the computing device;

9) when the second measure value corresponds to the second stored value, removing the activating control signal to stop the movement of the third and fourth transparent elements relative to one another, 10) directing the light beam into a first orthogonal surface of the first transparent element;

11) dividing the light beam into two portions and refracting the two portions of the light beam at a pair of angled planar surfaces having a first orientation on an opposite side of the first transparent element;

12) re-refracting the two portions of the refracted light beams back to the optical axis at a pair of angled planar surfaces on a first side of the second transparent element, which has a complementary structure to the first pair of angled planar surfaces; and 13) directing the two portions of the light beam into an exit orthogonal surface of the second transparent element;

14) directing the two portions of the light beam into a first orthogonal surface of the third transparent element;

15) dividing the two portions of the light beam into two additional portions and refracting the four portions of the light beam at a third pair of angled planar surfaces having a second orientation on an opposite side of the third transparent element, the second orientation being orthogonal to the first orientation around the optical axis;

16) re-refracting the four portions of the refracted light beams back to the optical axis at a fourth pair of angled planar surfaces on a first side of the fourth transparent element, which has a complementary structure to the third pair of angled planar surfaces; and 17) directing the two portions of the light beam into a second exit orthogonal surface of the fourth transparent element and then to a target.

A method for creating a quadrapolar variable light intensity profile in a photolithographic process according to the present invention comprising the steps of 1) through 17) above, wherein the second and third transparent elements are preferably joined at the perpendicular surfaces and steps 13) and 14) are combined into a single step.

In accordance with yet another embodiment of the present invention, there is provided an apparatus for exposing an object with a light, comprising:

A) a means for producing a light beam having a uniform intensity distribution;

B) a first refracting means for refracting the light beam into a plurality of divergent light beams;

C) a second refracting means for refracting the plurality of divergent light beams into a plurality of parallel light beams; and D) a means for exposing the object with light of the plurality of parallel light beams.

In accordance with still another embodiment of the present invention, there is provided an apparatus for exposing an object with a light, comprising:

A) a means for producing a light beam having a uniform intensity distribution;

B) a first refracting means for refracting the light beam into a plurality of divergent light beams;

C) a second refracting means for refracting the plurality of divergent light beams into a plurality of parallel light beams;

D) a means for controlling a relative displacement between the first refracting means and the second refracting means; and E) a means for exposing the object with light of the plurality of parallel light beams.

In still another embodiment of the present invention, there is provided an apparatus for exposing an object with a light, comprising:

A) a means for producing a light beam having a uniform intensity distribution;

B) a first refracting means for refracting the light beam into a plurality of divergent light beams;

C) a second refracting means for refracting the plurality of divergent light beams into a plurality of parallel light beams at a distance d1 from the first refracting means;

D) a third refracting means for refracting the plurality of parallel light beams into a double number of divergent light beams;

E) a fourth refracting means positioned at a distance d2 from the third refracting means for refracting the double number of divergent light beams into a same double number of parallel light beams;

F) a first controlling means for controlling a relative displacement between the first refracting means and the second refracting means;

G) a second controlling means for controlling a relative displacement between the third refracting means and the fourth refracting means; and H) a means for exposing the object with light of the plurality of parallel light beams.

In another embodiment of the present invention, there is provided an apparatus for exposing an object with a light, comprising:

A) a means for producing a light beam having a uniform intensity distribution;

B) a first refracting means for refracting the light beam into a plurality of divergent light beams about an optical axis;

C) a second refracting means positioned at a distance d1 from the first refracting means for refracting the plurality of divergent light beams into a plurality of parallel light beams about the optical axis;

D) a third refracting means for refracting the plurality of parallel light beams into a double number of divergent light beams about the optical axis;

E) a fourth refracting means positioned at a distance d2 from the third refracting means for refracting the double number of divergent light beams into a same double number of parallel light beams about the optical axis;

F) a fifth refracting means for refracting the same double number of parallel light beams in a broken annular pattern about the optical axis at a radius greater than a radius of the same double number of parallel light beams about the optical axis;

G) a sixth refracting means positioned at a distance d3 from the fifth refracting means for refracting the same double number of parallel light beams refracted in the broken annular pattern into the same double number of parallel light beams about the optical axis at a radius greater than the radius of the same double number of parallel light beams about the optical axis;

H) a first controlling means for controlling a relative displacement between the first refracting means and the second refracting means;

I) a second controlling means for controlling a relative displacement between the third refracting means and the fourth refracting means;

J) a third controlling means for controlling a relative displacement between the fifth refracting means and the sixth refracting means; and K) a means for exposing the object with light of the same double number of parallel light beams refracted in the broken annular pattern from the sixth refracting means.

In yet another embodiment of the present invention, there is provided an apparatus for controlling a light intensity profile, comprising:

a first planar refracting means for dividing an incident light beam into two portions and refracting the two portions away from an optical axis of the incident light beam;

a second planar refracting means for refracting the two portions of the light beam back in a direction that is parallel to, but displaced from, the optical axis; and a motive means for dynamically controlling a separation distance between the first and second planar refracting means, wherein a distance the two portions of the light beam are displaced from the optical axis is a function of the separation distance between the first and second planar refracting means.

The first planar refracting means may be a transparent element having a planar incident light beam entry surface perpendicular to the optical axis of the incident light beam, and a light beam exit surface consisting of at least two planar surfaces joined at an equal angle to the optical axis to form a concave configuration such that an apex of the angle is in the direction of the planar incident light beam entry surface. The second planar refracting means may be a transparent element having a light beam entry surface consisting of an equal number of planar surfaces as the light beam exit surface of the first planar refracting means and joined at an equal angle to the optical axis to form a convex configuration in mating arrangement with the light beam exit surface of the first planar refracting means, and a planar light beam exit surface perpendicular to the optical axis of the incident light beam.

In still another embodiment of the present invention, there is provided an apparatus for controlling a light intensity profile, comprising:

a first beam-refracting means for dividing an incident light beam into first divided parts and refracting the first divided parts of the light beam away from an optical axis of the incident light beam in a first direction;

a second beam-refracting means for refracting the first divided parts of the light beam parallel to the optical axis to produce a first diverged light beam;

a first motive means for controlling a relative displacement between the first beam-refracting means and the second beam-refracting means;

a third beam-refracting means for dividing the first diverged light beam in a direction that is orthogonal to the first direction and the optical axis into second divided parts and refracting the second divided parts away from an optical axis of the incident light beam and orthogonal to both the first direction and the optical axis;

a fourth beam-refracting means for refracting the second divided parts parallel to the optical axis to produce a second diverged light beam comprised of the divided parts; and a second motive means for controlling a relative displacement between the third beam-refracting means and the fourth beam-refracting means.

In another embodiment of the present invention, there is provided an apparatus for controlling a light intensity profile, comprising:

a first planar beam-refracting means located in a first plane on an optical axis for creating a first diverged light beam;

a second planar beam-refracting means located in a second plane on the optical axis for creating a second diverged light beam; and a conical beam-refracting means located in a third plane on an optical axis for creating a diverged annular light beam.

The first planar beam-refracting means may further comprise:

a first transparent refractive element for dividing an incident light beam and refracting the divided parts of the light beam away from an optical axis of the incident light beam in a first direction;

a second transparent refractive element for refracting the divided parts of the light beam parallel to the optical axis to produce a first diverged light beam; and a first motive means for controlling a relative displacement between the first and the second transparent refractive elements.

The second planar beam-refracting means may further comprise:

a third transparent refractive element for dividing the first diverged light beam and refracting the divided parts of the light beam away from the optical axis of the incident light beam in a second direction;

a fourth transparent refractive element for refracting the divided parts of the light beam parallel to the optical axis to produce a second diverged light beam; and a second motive means for controlling a relative displacement between the third and the fourth transparent refractive elements.

The first and second directions may be orthogonal to each other and to the optical axis. Moreover, the conical beam-refracting means may further comprise:

a concave conical transparent refractive element for refracting an incident light beam away from an optical axis of the incident light beam in an annular beam pattern;

a convex conical transparent refractive element for refracting the annular beam pattern parallel to the optical axis to produce a third diverged light beam; and a third motive means for controlling a relative displacement between the concave and the convex conical transparent refractive elements.

These and other features of the present invention will be readily apparent to those of ordinary skill in the art upon review of the detailed description that follows.

BRIEF DESCRIPTION OF THE DRAWINGS

FIG. 10 illustrates a schematic diagram of preferred elements of an illuminator optical system using the refractive apparatus shown in FIG. 9.

FIG. 11 illustrates a schematic diagram of a preferred embodiment of an illuminator optical system according to the present invention.

DETAILED DESCRIPTION OF THE INVENTION

The present invention provides an apparatus of profiling illumination for a photographic projection imager to produce a dipolar, quadrapolar, and/or annular configurations of illumination intensity without wasting illumination energy.

Figure 6:
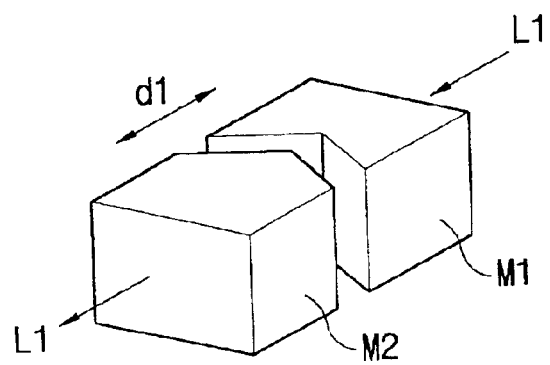
FIG. 6 illustrates a perspective view of a first embodiment of an apparatus for producing light beam divergence and a variable dipole illumination intensity profile according to the present invention.

FIG. 6 illustrates a perspective view of an apparatus for producing light beam divergence and a variable dipole illumination intensity profile according to a first embodiment of the present invention. Complementary transparent elements M1 and M2 preferably have opposing planar surfaces that are movable a predetermined distance d1 relative to each other along the optical axis of an incident light beam L1. The opposing planar surfaces produce a two dimensional divergence of light beam L1 and are arranged for forming a variable dipole illumination intensity profile.

Figure 7:
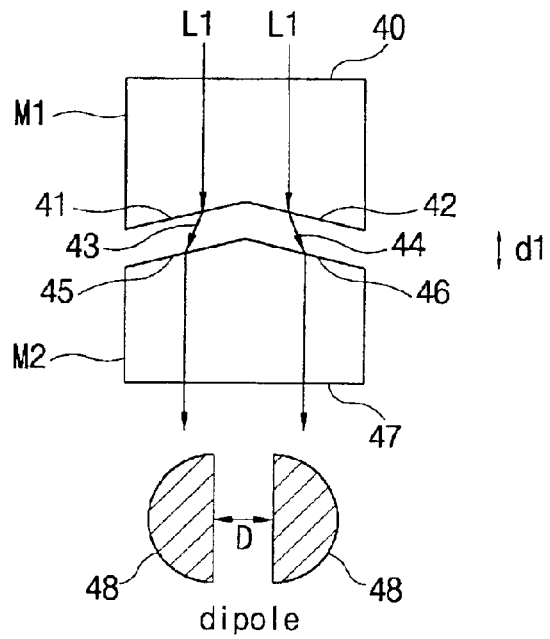
FIGS. 7 and 8 illustrate schematic views of concentric refractive elements shown in FIG. 6 in different relative positions.
Figure 8:
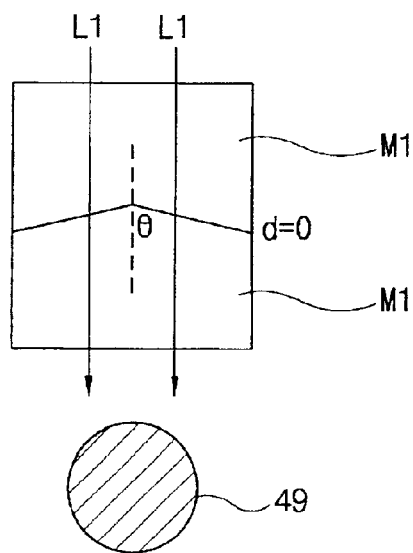

FIGS. 7 and 8 illustrate schematic views of concentric refractive elements shown in FIG. 6 in different relative positions. Light beam L1 impinges on surface 40 of transparent element M1, which is perpendicular to the optical axis and produces no beam divergence at the interface between the air and the denser transparent element M1. At planar interface surfaces 41 and 42, the refraction of light beam L1 travels into a preferably lower density air media and thus away from the optical axis, as indicated by the beams labeled 43 and 44. The combined intensity of the divergent light beams 43 and 44 is about equal to the intensity of the light beam before refraction at surface 42 of transparent element M1. It is possible to lose a certain amount of light intensity as the light travels through transparent elements M1 and M2. This loss in intensity depends, however, on the level of transparency and the amount of light blocking impurities in transparent elements M1 and M2. Accordingly, by using high quality transparent materials having very low levels of impurities, the loss in light intensity as the light travels through M1 and M2 may be minimized to a point that it becomes negligible.

Additionally, the divergent light beams 43 and 44 may be refracted at about the same angles or different angles. Generally, the divergent light beams are refracted at the same angles. However, there may be instances where the light beams are refracted at different angles to achieve and obtain different exposure patterns depending on the desired exposure pattern.

Beams 43 and 44 continue through the re-directed path until they impinge on equally-angled planar surfaces 45 and 46 of transparent element M2, respectively. Since transparent element M2 is preferably constructed of a same material as transparent element M1, the refractive interface is from air back to a more dense material, thus producing refraction back toward the optical axis, and preferably back to along the original optical axis. The dual light beams traverse through transparent element M2 and impinge on perpendicular exit surface 47, where no divergence occurs. The two exit light beams 48 each represent a semicircular half of the original circular light beam L1, and are displaced by a displacement distance D, thereby producing a dipole illumination intensity profile. The combined intensity of the two exit light beams 48 should be about equal to the intensity of the incident light beam before refraction at surface 42 of transparent element Resolution of the resulting beams 48 may be controlled by the angle of the planar surfaces relative to the optical axis. While a preferred embodiment would feature two planar interface surfaces 41 and 42 as being perpendicular to each other (i.e., θ=45 degrees), by decreasing the angle of incidence at planar interface surfaces 41 and 42, higher resolution (i.e., sharpness) of the resulting beams 48 may be obtained. However, such decreased angle of incidence also yields a correspondingly smaller divergence for a given separation distance of the opposing refractive elements. Thus, the separation distance must be made accordingly greater to obtain a same sized displacement of an exit beam as may be obtained using a pair of planar interface surfaces 41 and 42 having a larger angle of incidence.

The displacement distance D is preferably proportional to the separation distance d1 between the planar surfaces 41 and 45 and the planar surfaces 42 and 46. Thus, the size of the exiting light dipoles may be directly controlled by the separation means. For example, distance d1 may be controlled by a motor with a gear, worm, or belt drive, wherein circular motion of the motor axle is translated into lateral force on one or both of the transparent elements M1 and M2. While such a motor has limitations regarding slippage and motive steps similar to those of the prior art, use of reduction gears in the motor of the present invention and absence of a radial multiplying effect from the origin to the circumference of the rotating plate of the prior art, greatly reduces such detrimental effects in the present invention.

Alternatively, electrostatic and electromagnetic means may be used to provide a controlled displacement between transparent elements M1 and M2. Such transparent elements M1 and M2 may be manufactured with ferrous materials or conductive coils included to facilitate such control means. It is assumed that all such motive arrangements will preferably be controlled by a computing device, such as a personal computer, a micro-controller, or a digital signal processor, operating through analog or digital sensors in communication with the computing device via analog-to-digital converters. It is further contemplated that the motor controls comprise conventional driver devices communicated via digital to analog type converters. The specific methods for such feedback control loops are well known in the art and are not discussed at length here.

In FIG. 8, opposing refractive surfaces are in contact, and no air medium refracts the incident light beam L1, thereby preserving the original light beam as beam pattern 49. Varying distances d1 between the plates will produce intermediate sized and displaced dipoles between those shown in FIG. 7 and FIG. 8 as discussed above.

The degree of light beam divergence is controlled by the relative densities of the two interface materials on either side of the refracting plane, the orientation angle of the planar surfaces relative to the optical axis, i.e., the angle of incidence, and the separation distance between the opposing parallel surfaces. According to the present invention, the opposing planar surface and transparent material are preferably designed to restore the light beam parallel to the original optical axis with a central displacement from the optical axis. Further, while the above discussion uses air as the lower density media between the two transparent refracting elements for ease of manufacture and maintenance, other transparent fluid or gaseous media of known index of refraction could be used with suitable containment or encapsulation, including a near-vacuum.

In summary, the first transparent element, or diverging element, encountered by the incident light beam, is preferably refractive and preferably has a triangular surface arranged for diverging the illumination into a dipole intensity profile. The second transparent element is also preferably refractive with a complementary opposing triangular surface. Moving the elements apart enlarges the distance of the dipole profile of the illumination, and moving the elements into proximity restores the illumination to an un-diverged condition so that the illumination intensity profile is not dipoled.

Figure 9:
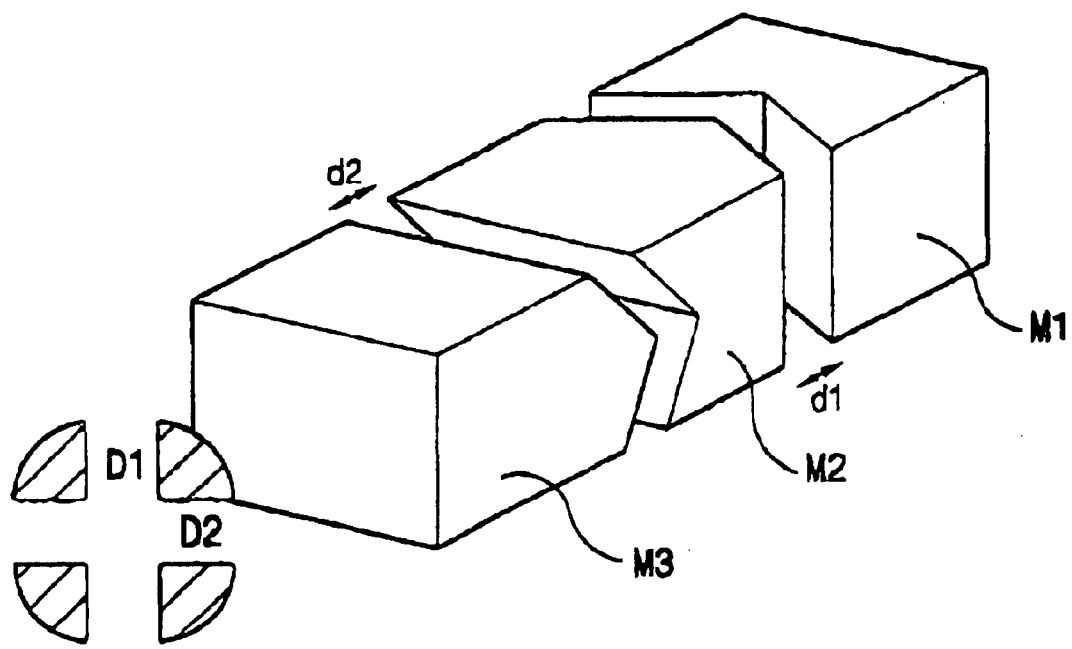
FIG. 9 illustrates a perspective view of concentric refractive elements producing light beam divergence which are arranged for forming a variable quadrapolar illumination intensity profile according to a second embodiment of the present invention.

FIG. 9 schematically illustrates an apparatus having three triangular refractive elements arranged for producing variable illumination divergence according to a second embodiment of the present invention. In FIG. 9, a central refractive element M2 has two triangular surfaces, one triangular surface on each of opposing sides along the optical axis. The two triangular surfaces are oriented perpendicular to each other about the optical axis, such that a division and refraction occurs independently along both the vertical and the horizontal axes as viewed in FIG. 9. FIG. 9 illustrates that the radius of a resulting beam pattern and distances D1 and D2 of the quadrapole illumination profile can be varied by controlling the separation distances d1 and d2, respectively, between the refracting elements. If one of the distances d1 or d2 of the apparatus is set to zero, the first embodiment shown in FIG. 6 results.

FIG. 10 illustrates an exemplary projection exposure apparatus, which incorporates an embodiment of the refractive apparatus shown in FIG. 9. An exposure light L1 is made uniform by a fly-eye lens 14. One embodiment of a diverging controller 33 comprises three refractive elements 35 (M1 of FIG. 9), 36 (M2 of FIG. 9) and 37 (M3 of FIG. 9) with confronting triangular surfaces. A triangular surface of refractive element 35 diverges the illumination into a dipole configuration of intensity having a radius that increases with a distance d1. Refractive element 36 has two triangular surfaces 36a and 36b, which are oriented perpendicular to each other about the optical axis at a predetermined separation distance. The triangular surface 36b of element 36 diverges the dipole illumination in the second axis, producing a quadrapolar configuration of intensity having a radius that increases with a distance d2.

The diverging controller 33 controls distances d1 and d2 according to an algorithm in a computer. The exposure light L1 that exits from the refractive element 37 may pass through a lens 23, a lens 24, a mirror 25, a lens 26, a reticule R and the objective imaging system. The reticule pattern image is preferably formed onto a resist film on the wafer W.

Referring to FIG. 9, displacement of M1, M2, and M3 relative to each other may be obtained by the previously discussed motive means, such as a motor with gears or belts, in addition to electrostatic and/or electromagnetic means. Various relative combinations of movable elements may be used to obtain the desired displacement. For example, refractive element M2 is preferably fixed with refractive elements M1 and M3 being movable by a pair of motive devices to control distances d1 and d2, respectively. Thus, d1 and d2 may be controlled independently to produce a variety of shapes in a resulting light intensity profile.

Alternatively, for systems wherein a uniform and proportional increase in both dimensions of the profile is desired, a single motive means may be employed with proportional gearing that yields equal vertical and horizontal divergences. Such a gearing mechanism may also be applied to an apparatus wherein refractive element M2 of FIG. 9 is partitioned into two separate, but optically aligned, refractive elements, thereby allowing a single motive means to proportionally create the necessary displacement for each set of opposing planar interface surfaces either dependently or independently of the other.

Figure 1:
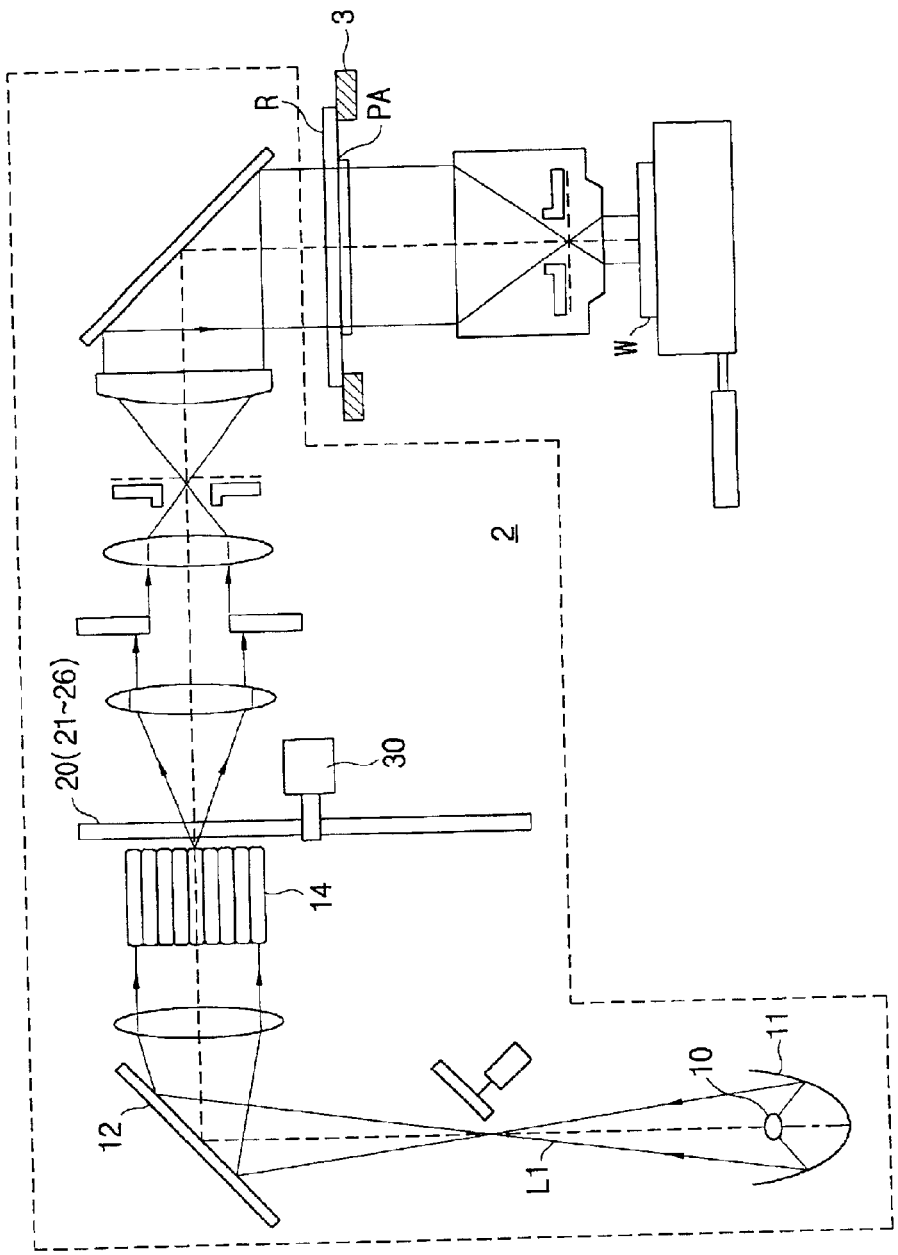
FIG. 1 illustrates a schematic diagram showing the structure of a conventional projection exposure apparatus.
Figure 2:
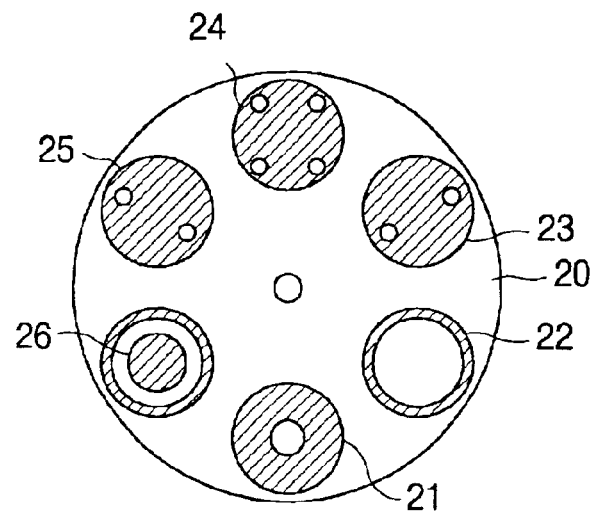
FIG. 2 illustrates a front view of a conventional rotational plate having a plurality of different types of aperture stops.
Figure 3:
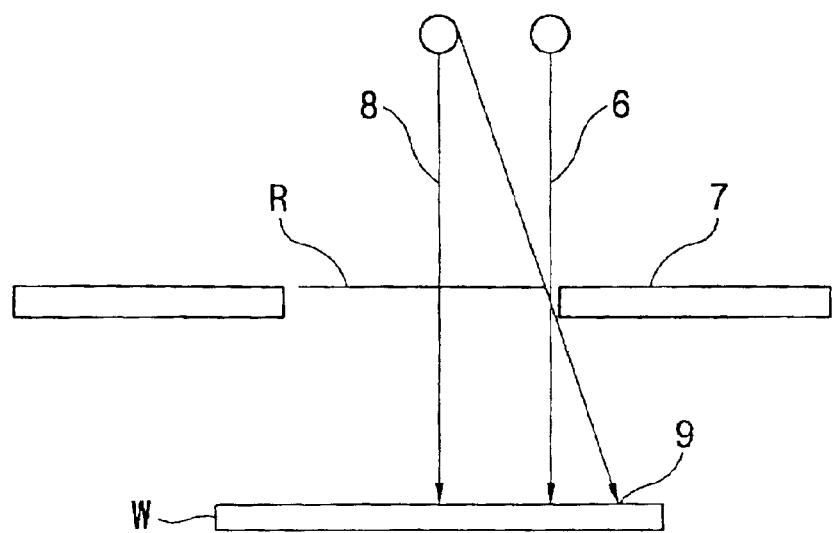
FIG. 3 illustrates a dispersed light beam passing through reticule R of FIG. 1.
Figure 4:
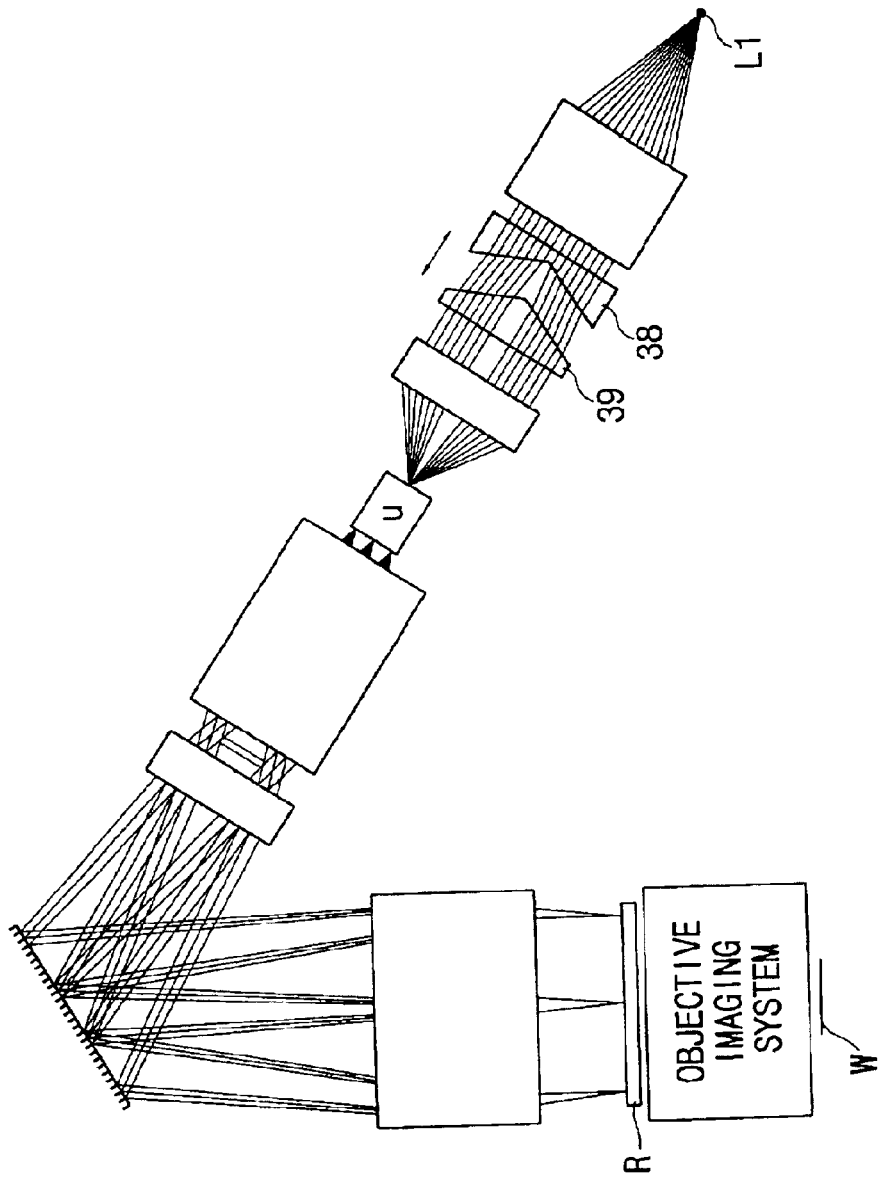
FIG. 4 illustrates a schematic diagram of a conventional illuminator optical system.

It is apparent that the discontinuity areas created by the diverged light beam portions may be filled/exposed using a variety of means. For example, for a non-collimated beam, or a less than optimally collimated beam, a natural dispersion cone can fill such discontinuities, as shown in FIG. 3. Other optical means, such as the prismatic dispersion of the different color elements of the light spectrum may be controllably refracted to the central discontinuity areas, thereby exposing the photo-resist material on those areas of a wafer W. A design tradeoff is made between a beam sharpness at edges of a reticule R that prevents "light spillage" outside the masked area of reticule R and a beam dispersion cone that fills the discontinuity areas created by the division and refraction of the embodiments of the present invention.

Figure 5:
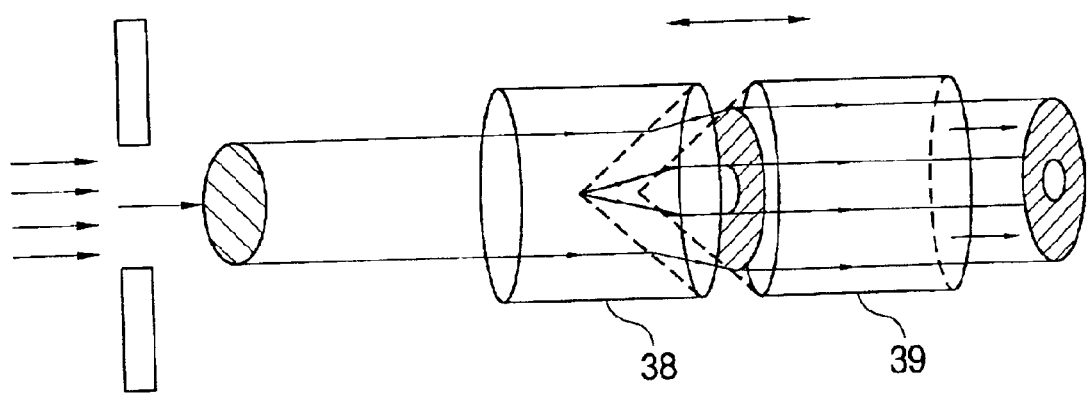
FIG. 5 illustrates an exploded view of the conical refracting apparatus shown in FIG. 4.

FIG. 11 illustrates another preferred embodiment according to the present invention which is similar to the embodiment shown in FIG. 10, wherein the planar quadrapolar refractive elements 35, 36, and 37 of the second or third embodiment are combined with conventional complementary conical refractive elements 38 and 39 shown in FIG. 5 to produce a combined versatile refracting apparatus 33 capable of projecting a bipolar, a quadrapolar, or an annular light intensity profile, depending on the separations between the complementary refractive elements. A computer and monitoring sensor may be used to control the relative positioning of the refractive elements relative to each other. As previously mentioned, sensors may be devices that sense light intensity, light dispersion, or lateral movement of the refractive elements. Such sensing devices are not intended to be restricted to measurement devices acting directly within the optical axis, but may encompass various indirect measurement means as are known in the art. Lateral distance d1, d2, and d3 provide the degree of refraction of an incident light beam L1.

To create a bipolar beam as shown in FIG. 7, d2 and d3 are set to zero, while d1 is controllably set to a predetermined separation distance. To create a quadrapolar beam, d3 is set to zero while d1 and d2 are controllably set to a predetermined separation distance. In either case of the bipolar beam and the quadrapolar beam, d3 may be adjusted in order to control the annular spread of each of the beams. Similarly, to create only an annular beam, d1 and d2 would be set to zero while d3 is varied a predetermined separation distance. Various combinations of the above displacements can be used to produce a wide variety of light beam shapes, dispersion patterns, and light intensity profiles.

The placement sequence of the different refractive elements shown in FIG. 11 may be varied along the optical axis without deviating from the scope of the present invention. For example, conical refractive elements 38 and 39 may be placed in the initial refracting position and followed by the planar quadrapolar refractive elements 35, 36, and 37 along the path of the incident light beam L1.

In all of the foregoing embodiments and their derivatives, calculations on the reflections of rays may be made by applying the well-known equations for the refraction of light at the interface between transparent materials having different indices of refraction (i.e. different densities). The planar and/or conical complementary surfaces provide for a division, a refraction, and a corrective refraction at a controllable divergent distance from the optical axis of an incident light beam via the transmittance properties of the refractive elements.

Preferred embodiments of the present invention have been disclosed herein and, though specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. An apparatus for exposing an object with a light, comprising:

A) a means for producing a light beam having a uniform intensity distribution;

B) a first refracting means for refracting the light beam into a plurality of divergent light beams about an optical axis;

C) a second refracting means positioned at a distance d1 from the first refracting means for refracting the plurality of divergent light beams into a plurality of parallel light beams about the optical axis;

D) a third refracting means for refracting the plurality of parallel light beams into a double number of divergent light beams about the optical axis;

E) a fourth refracting means positioned at a distance d2 from the third refracting means for refracting the double number of divergent light beams into a same double number of parallel light beams about the optical axis;

F) a fifth refracting means for refracting the same double number of parallel light beams in a broken annular pattern about the optical axis at a second radius greater than a first radius of the same double number of parallel light beams about the optical axis;

G) a sixth refracting means positioned at a distance d3 from the fifth refracting means, for refracting the same double number of parallel light beams refracted in the broken annular pattern into the same double number of parallel light beams about the optical axis at a third radius greater than the first radius of the same double number of parallel light beams about the optical axis;

H) a first controlling means for controlling a relative displacement between the first refracting means and the second refracting means;

I) a second controlling means for controlling a relative displacement between the third refracting means and the fourth refracting means;

J) a third controlling means for controlling a relative displacement between the fifth refracting means and the sixth refracting means; and K) a means for exposing the object with light of the same double number of parallel light beams refracted in the broken annular pattern from the sixth refracting means.

2. The apparatus as claimed in claim 1, wherein the first refracting means refracts the light beam into a plurality of divergent light beams at about a same angle.

3. The apparatus as claimed in claim 1, wherein the first refracting means refracts the light beam into a plurality of divergent light beams at different angles.

4. The apparatus as claimed in claim 2, wherein the first refracting means refracts the light beam into two divergent light beams.

5. The apparatus as claimed in claim 1, wherein the means for exposing the object with the light of the same double number of parallel light beams refracted in the broken annular pattern from the sixth refracting means is a reticule pattern.

6. The apparatus as claimed in claim 1, wherein the object is a semiconductor wafer.

7. The apparatus as claimed in claim 1, wherein the object is a photoresist layer on a semiconductor wafer.

8. The apparatus as claimed in claim 2, wherein the angle is between about 45 to about 90 degrees.

9. The apparatus as claimed in claim 1, wherein d1 is zero.

* * * * *